United States Patent

Scarlett

[15] 3,671,793

[45] June 20, 1972

[54] HIGH FREQUENCY TRANSISTOR STRUCTURE HAVING AN IMPEDANCE TRANSFORMING NETWORK INCORPORATED ON THE SEMICONDUCTOR CHIP

[72] Inventor: Robert M. Scarlett, Palo Alto, Calif.

[73] Assignee: International Telephone and Telegraph Corporation, Nutley, N.J.

[22] Filed: Sept. 16, 1969

[21] Appl. No.: 858,257

[52] U.S. Cl. ....................317/235 R, 317/234 N, 317/235 H, 317/235 WW, 307/282

[51] Int. Cl. ....................................H01l 11/00, H01l 15/00

[58] Field of Search ........................317/234, 235, 23, 26, 31; 307/282, 308

[56] References Cited

UNITED STATES PATENTS

| | | | |
|---|---|---|---|
| 3,325,704 | 6/1967 | Beiasco et al. | 317/234 |
| 3,339,127 | 8/1967 | Darter et al | 317/234 |
| 3,387,190 | 6/1968 | Winkler | 317/234 |
| 3,489,956 | 1/1970 | Yanai et al. | 317/234 |
| 3,509,434 | 4/1970 | Yanai et al. | 317/234 |
| 3,486,082 | 12/1969 | Sakamoto | 317/234 |
| 3,555,375 | 1/1971 | Hilbers | 317/234 |
| 2,695,930 | 11/1954 | Wallace | 317/235 |
| 3,191,070 | 6/1965 | Jones et al. | 317/235 |
| 3,198,988 | 8/1965 | Nieda | 317/235 |
| 3,389,230 | 6/1968 | Hudson | 317/235 |

FOREIGN PATENTS OR APPLICATIONS

| | | | |
|---|---|---|---|
| 1,056,335 | 1/1967 | Great Britain | 317/235 |

*Primary Examiner*—John W. Huckert
*Assistant Examiner*—Andrew J. James
*Attorney*—C. Cornell Remsen, Jr., Walter J. Baum, Paul W. Hemminger, Percy P. Lantzy, Philip M. Bolton, Isidore Togut and Charles L. Johnson, Jr.

[57] ABSTRACT

This is a semiconductor component having an active semiconductor device formed within a substrate, and an impedance transforming network incorporated on said substrate and coupled to said device so as to reduce the effect of the device lead inductance which is common to both a circuit input and output.

7 Claims, 13 Drawing Figures

PATENTED JUN 20 1972 3,671,793

SHEET 1 OF 3

INVENTOR
ROBERT M. SCARLETT
BY Stephen A. Young
ATTORNEY

INVENTOR
ROBERT M. SCARLET
BY Stephen A. Young
ATTORNEY

INVENTOR
ROBERT M. SCARLETT
BY Stephen A. Young
ATTORNEY

HIGH FREQUENCY TRANSISTOR STRUCTURE HAVING AN IMPEDANCE TRANSFORMING NETWORK INCORPORATED ON THE SEMICONDUCTOR CHIP

BACKGROUND OF THE INVENTION

This invention relates to a high frequency response transistor having improved operating characteristics.

Very often high frequency power transistors are operated in the common emitter configuration when used in amplifier circuits. When transistors are operated in the common emitter configuration, there is an emitter lead inductance $L_e$ common to both the input and output circuit. This inductance generally resides in the wire connecting the emitter bonding pad on the transistor chip to the common circuit ground. If the common circuit ground connection is outside the package, $L_e$ will include the inductance of the pin leading through the package. For the stripline package described in U.S. Pat. No. 3,387,190, the effective lead inductance common to both input and output circuits extends only inside the package. In any case, wires bonded from a bonding pad on the chip to some portion of the package form at least a portion of the common lead inductance $L_e$.

It should be understood that this common lead inductance would be found in series with the base pad for transistors which would be used in the common base configuration, such transistors being frequently used at the input RF stages of receivers. Also, this common lead inductance would be of concern to transistors used in the common collector configuration for high frequency emitter follower, i.e., buffer amplifier transistor applications. While it is understood that the inventive concept of this application relates to negating the effect of lead inductance common to both input and output circuits for common emitter, common base and common collector operation, for the purposes of this application we will limit our discussion, by way of example, to the emitter lead inductance common to the input and output circuits for the common emitter configuration.

The main problem arising from excessive lead inductance is that the high frequency performance of the device is seriously impaired due to the sharp increase in impedance of the lead inductance at high frequencies. The useful operating range of an amplifier is generally described in terms of a relatively constant gain over a specific operating frequency. A useful approximate criteria which can be used is that in which the gain is not significantly effected as long as the following relationship exists:

$$2\pi f L_e < R_{in} \qquad \text{(Equation 1)}$$

where $f$ is the operating frequency and $R_{in}$ is the transistor input resistance.

Another useful relationship in transistor amplifier circuits which can be derived in terms of the fundamental properties of silicon, is $$p.G.R_{in} \, . \, f^2 \cong 20 \text{ (Equation 2)},$$

where is the power output of the amplifier in watts;

$G$ is the power gain;

$R_{in}$ is the input resistance in ohms; and $f$ is the operating frequency in GHz.

When combining equations 1 and 2 and solving for $L_e$, we find that $$L_e \lesssim 3.2/P.Gf^3 \qquad \text{(Equation 3)}$$

where $L_e$ is in nanohenries;

$P$ is in watts; and $f$ is in GHz.

In a first example, when $P$ is equal to 20 watts, $G$ is equal to 4 and $f$ is equal to 0.5 GHz, then $L_e$ must be less than 0.32 nhy. In a second example, if $P$ is equal to 10 watts, $G$ is equal to 4 and $f$ is equal to 2 GHz, then $L_e$ must be less than 0.01 nhy.

For a piece of wire which would be used to connect the emitter bonding pad to another part of the circuit or package, its inductance $L$ would be defined by the following well-known relationship:

$$L=2l\left[\frac{ln2l}{r}-1\right]nhy \qquad \text{(Equation 4)}$$

where $l$ is the length of the wire in centimeters and $r$ is the wire radius in centimeters.

For a wire having a radius of 0.01 centimeters and a length of 0.1 centimeters, the inductance $L$ would equal 0.4 nhy.

If a piece of solid ribbon of length $l$ and width w were used instead of the wire, this ribbon would have an inductance $$L \approx (4l^2/w) \text{ nhy} \qquad \text{(Equation 5)}$$

provided that $w$ was greater than $l$.

If $l$ is equal to 0.1 centimeters, $w$ is equal to 0.5 centimeters and $L$ is equal to 0.08 nhy, we can thus see that the inductance figures arrived at for the wire and ribbon are greater than would be acceptable in the second example given above where $L_e$ had to be less than 0.01 nhy.

SUMMARY

It is an object of this invention to improve the frequency response of a high frequency transistor.

It is another object of this invention to reduce the effect of lead inductance, which is common both to the input and output circuit, on the high frequency response of the device.

According to a broad aspect of this invention, there is provided a semiconductor component comprising an active component formed within a substrate, and an impedance transforming network incorporated on said substrate so as to reduce the effect of the device lead inductance which is common to both a circuit input and output.

In a feature of this invention, the active component has an emitter, base and collector and the impedance transforming network is coupled to the base and emitter.

In another feature of this invention, the impedance transforming network includes a transformer having a primary and secondary winding, said secondary winding being coupled to said base and emitter electrodes and said primary winding being coupled to pads on said substrate to provide for input terminals for said device.

In a further feature of this invention, the impedance transforming network includes a film inductor and capacitor disposed on said substrate, one terminal of said inductor being coupled to said base electrode, one terminal of said capacitor being coupled to said emitter electrode, and the other terminal of said inductor being coupled to the other terminal of said capacitor.

In another feature of this invention, the impedance transforming network includes a transformer having a primary and secondary winding, said primary winding being coupled to pads on said substrate to provide for input terminals for said device, one terminal of said primary winding being attached to one terminal of said secondary winding, and a capacitor disposed on said substrate, one terminal of said capacitor being coupled to said emitter electrode, the other terminal of said capacitor being coupled to said one terminal of said secondary winding, and the other terminal of said secondary winding being coupled to said base electrode.

DESCRIPTION OF THE PREFERRED EMBODIMENTS

Figure 1:
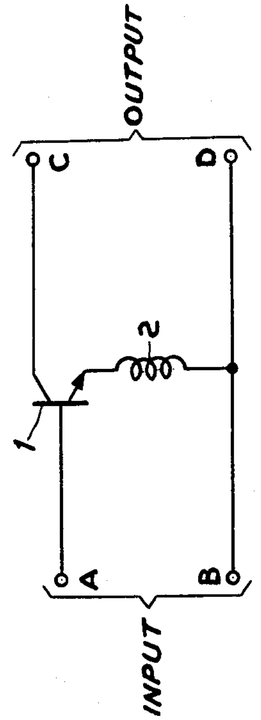
FIG. 1 is the equivalent circuit of the prior art device having the emitter lead inductance common to both input and output circuits.

FIG. 1 shows a circuit equivalent of the prior art transistor 1 which has a lead inductance 2 ($L_e$) in series with the emitter and common to both the input and output circuit. The input is taken across terminals A and B, respectively, and the output being taken across C and D, respectively.

Figure 2:
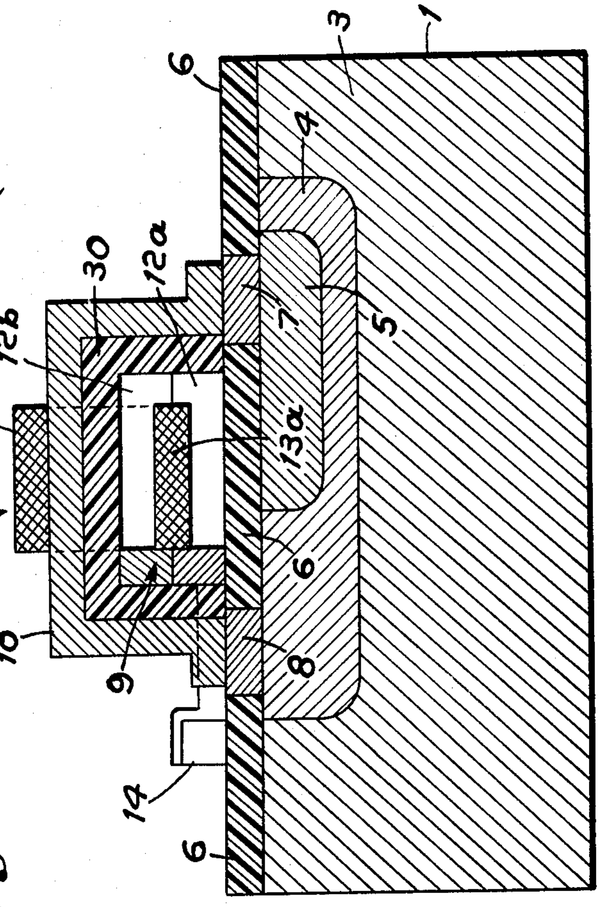
FIG. 2 is one embodiment of this invention having a thin film transformer incorporated on the substrate of a device.

This common lead inductance $L_e$ can be reduced by incorporating a proper impedance transforming network on a substrate containing the device, as shown in FIG. 2. In the example given in FIG. 2, a high frequency transistor is formed within substrate 3. By way of example, substrate 3 can be of *n* conductivity type and can serve as the collector for the device. A base region 4 of opposite conductivity type can be formed within the substrate 3 and an emitter region 5 of the same conductivity type as the substrate can be formed within the base region. By way of example, the collector and emitter regions can be of n-type conductivity and the base region 4 can be of the p-type conductivity. The base region 4 forms a corresponding pn junction with collector region, i.e. substrate 3, which junction extends to the surface of the device. Likewise, region 5 forms a pn junction with region 4, which junction also extending to the surface of the device. The device formed within substrate 3 is fabricated using standard photolithographic, masking and diffusion techniques. Passivation layer 6 can be a thermally grown oxide of silicon or it can be a layer of silicone nitride grown using standard rf glow discharge techniques. This layer 6 at the surface of the substrate is used to passivate and protect those portions of the pn junctions extending to the substrate surface. This passivation layer has appropriate holes formed therein exposing portions of the emitter and base regions, respectively. Electrodes 7 and 8 can be formed using standard photolithographic, masking and evaporation or sputtering techniques to establish the respective emitter and base electrodes.

The impedance transforming network, which is incorporated on substrate 3, is comprised of a film transformer formed thereon so that the lead inductance $L_e$ external to the emitter bonding pad is no longer common to both the input and output circuits, thus reducing its effect on the gain of the transistor when used in an amplifier operating at high frequencies.

Figure 3:
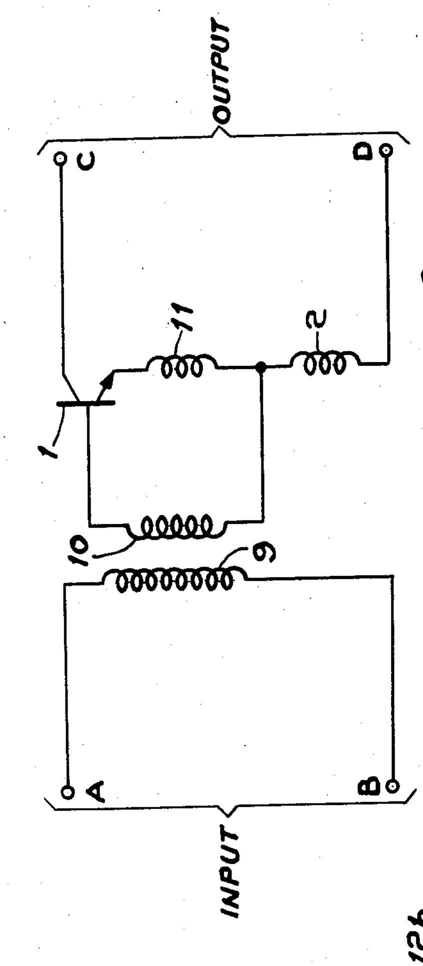
FIG. 3 is an equivalent circuit of the device shown in FIG. 2.

FIG. 3 shows an equivalent circuit of the component shown in FIG. 2. Primary 9 of this component is connected to bonding pads on the substrate corresponding to input terminals A and B, respectively, of the film transformer. The primary consists of n turns with respect to the secondary 10. The secondary 10 of the transformer can actually have, for design purposes, a single turn. The secondary winding itself will be directly connected to the base and emitter bonding pads. Thus, the lead inductance 11 which will be common both to the input and output circuit (for the sake of description we will refer to this inductance as $L_e'$) will be limited to the inductance existing between the emitter bonding pad and the emitter region. It is thus quite obvious that this lead inductance which is common to both the input and output of the device, will be much smaller than the critical maximum values of the lead inductance allowable for good high frequency operating performance which was calculated in the first and second examples given in the background of the invention. Furthermore, the very low input resistance of the transistor is reflected from the secondary into the primary of the transformer and is seen across input terminals A and B as $n^2R_{in}$, thus sharply reducing input circuit losses. The output of the component is taken across C and D which may or may not be within the final component package, and inductance 2 ($L_e$) which is external to the emitter bonding pad is no longer common to both the input and output circuits.

Figure 4:
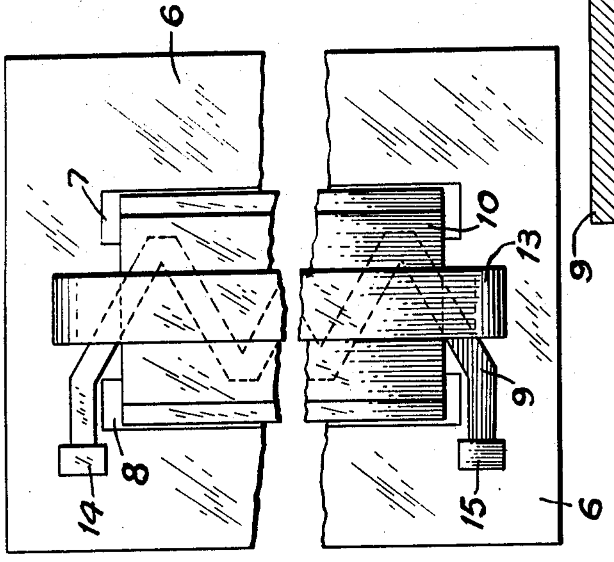
FIG. 4 is a top view of the impedance transforming network shown in FIG. 2.

The film transformer incorporated on the substrate shown in FIG. 2, the top view of which is shown in FIG. 4, can be formed by standard evaporation or sputtering techniques through appropriate masks. For the device shown in FIG. 2, the lower turns 12*a* of the primary coil 9 can be evaporated or printed over that portion of passivation layer 6 between the emitter and base electrodes. The primary coil 9 is comprised of a suitable conductive material such as aluminum, platinum or copper. The lower portion 13*a* of a core would then be formed over the lower primary turns by sputtering, sintering or any other suitable technique. This material would have to be a relatively high permeability material, such as manganese zinc ferrite having the formula $MnO_2 + Fe_2O_3 + ZnO_2$. This material has a high dielectric constant K approximately equal to 10,000 and a high insulation resistance so that the primary and secondary turns of the transformer contiguous with this core will not require any insulation. After the lower branch of the core is thus formed, the upper primary turns 12*b* would then be evaporated or printed over the upper surface of the lower core branch, using conventional evaporation or printed techniques. The upper primary turns extend around the edges of the lower core branch so that they are contiguous with the lower primary turns, thus forming the completed primary winding which surrounds the lower core branch 13*a*. The end terminals of the primary turns would extend beyond the core onto bonding pads 14 and 15 on the substrate, as shown in FIG. 4, which pads would correspond to inputs A and B of the device as characterized in FIG. 3. A second layer of insulating material 30 would then be deposited over the upper primary turns and extend down to the first insulating layer. This second insulating layer can consist of an oxide or nitride of silicon and can be grown using conventional masking and photolithographic techniques. The secondary winding 10 can then be evaporated over the second insulating layer and extend to the emitter electrode 7 and base electrode 8. This secondary winding will, of course, consist of a highly conductive material, such as aluminum or copper, and can, in effect, consist of a single winding or sheet. The upper branch of the core 13*b* can then be deposited (by sputtering, sintering or any other suitable technique) over winding 10 and around the edge of the total stack so as to be contiguous with the lower branch core 13*a*, thus forming a closed magnetic flux path for the primary and secondary windings. The magnetic core 13 is shown in FIG. 4 along with the primary winding 9 and the secondary winding 10.

Figure 5:
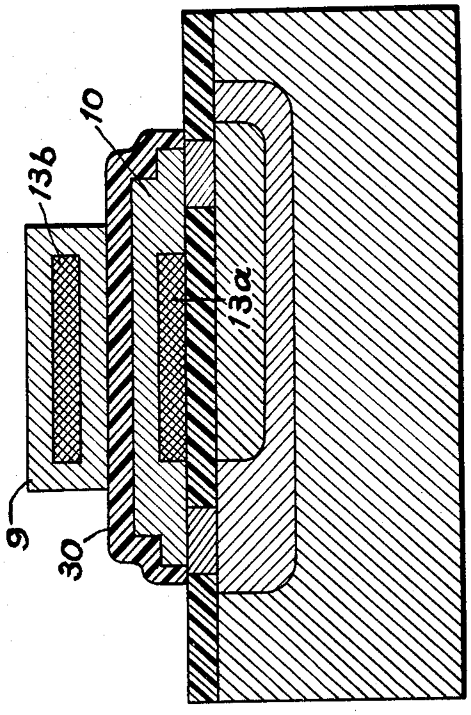
FIG. 5 is another embodiment of this invention.

FIG. 5 shows an alternate embodiment of FIG. 2 where the secondary winding 10 is formed over the lower core branch 13*a* and the primary winding 9 is formed over the upper core branch 13*b*.

Figure 6:
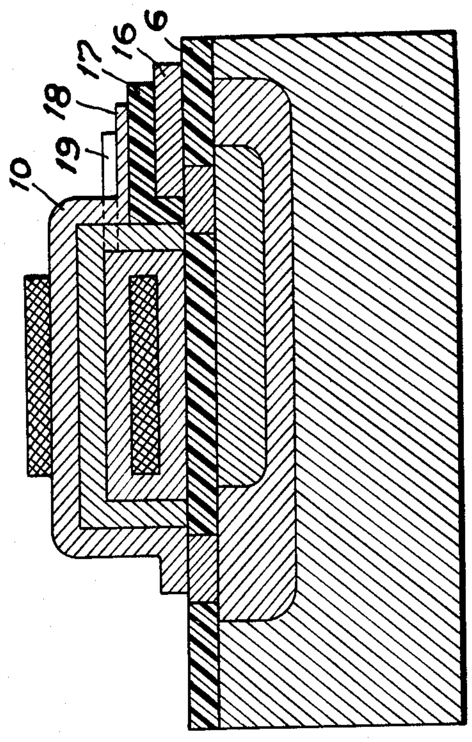
FIG. 6 is a further embodiment of the invention shown in FIG. 2 having a blocking capacitor inserted between the secondary winding and the emitter bonding pad.

FIG. 6 shows another alternate embodiment similar to that shown in FIG. 2 except that a thin film capacitor has been formed between one terminal of the secondary winding and the emitter electrode. This is accomplished by evaporating a suitable electrode 16, such as platinum or aluminum, over the emitter electrode and extending over a portion of the first insulating layer 6. A dielectric material 17, such as tantalum oxide, could then be reactively sputtered over a portion of electrode 16. Alternatively, an aluminum oxide dielectric may be either reactively or rf sputtered or silicon oxide could be evaporated instead of the tantalum oxide. The secondary winding 10 when formed as explained before could then extend over the dielectric layer 17 instead of directly connecting the emitter electrode. That portion of the secondary winding which extends over dielectric layer 17 could then serve as the other electrode 18 of the thin film capacitor. The actual capacitance *C* of the capacitor thus formed would be governed by the relationship $$C = (KA/d) \quad \text{(Equation 6)}$$

where $K$ is the dielectric constant of the dielectric layer;

$A$ is the common area shared by capacitor electrodes 16 and 18; and $d$ is the thickness of the dielectric layer.

Figure 7:
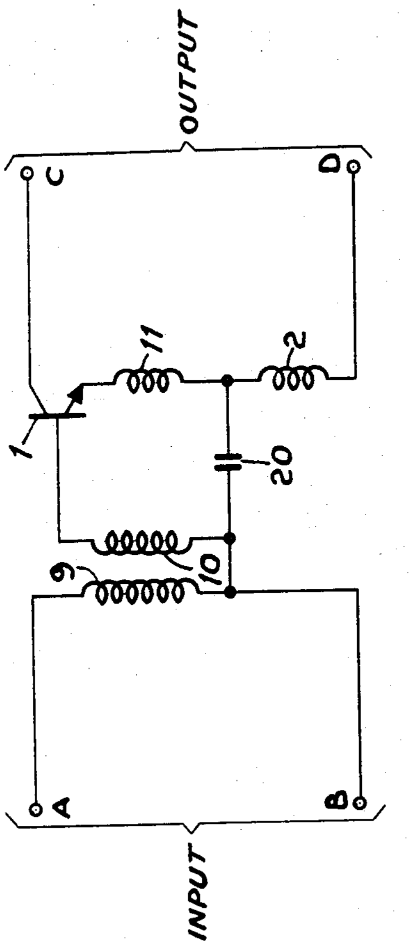
FIG. 7 is the equivalent circuit of the device shown in FIG. 6.

It should also be noted that the only other difference between this embodiment shown in FIG. 6 and the one depicted in FIG. 2 is that one end of the primary winding 19 can extend to be contiguous with that end of the secondary winding which serves as the electrode 18 for the thin film capacitor thus formed. FIG. 7 is an equivalent circuit representation of the device shown in FIG. 6 wherein the thin film capacitor is shown as element 20. It is thus noted that this embodiment has the advantage over the embodiment shown in FIGS. 2, 3 and 5 in that a dc biasing potential can be directly applied to the base of transistor 1 directly from input terminals A and B due to the common dc connection between the respective primary and secondary windings 9 and 10. The blocking capacitor 20 then serves to allow the dc biasing voltage to be applied directly to the base from the input circuit while directly isolating the emitter from the input circuit.

Figure 10:
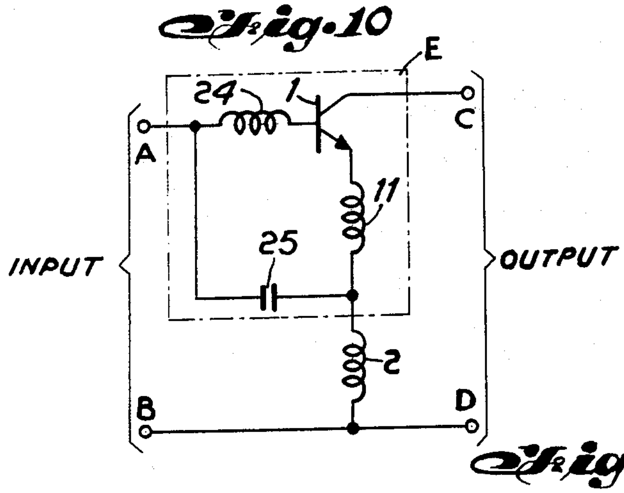
FIG. 10 is the equivalent circuit of the device shown in FIG. 8; FIG.
Figure 9:
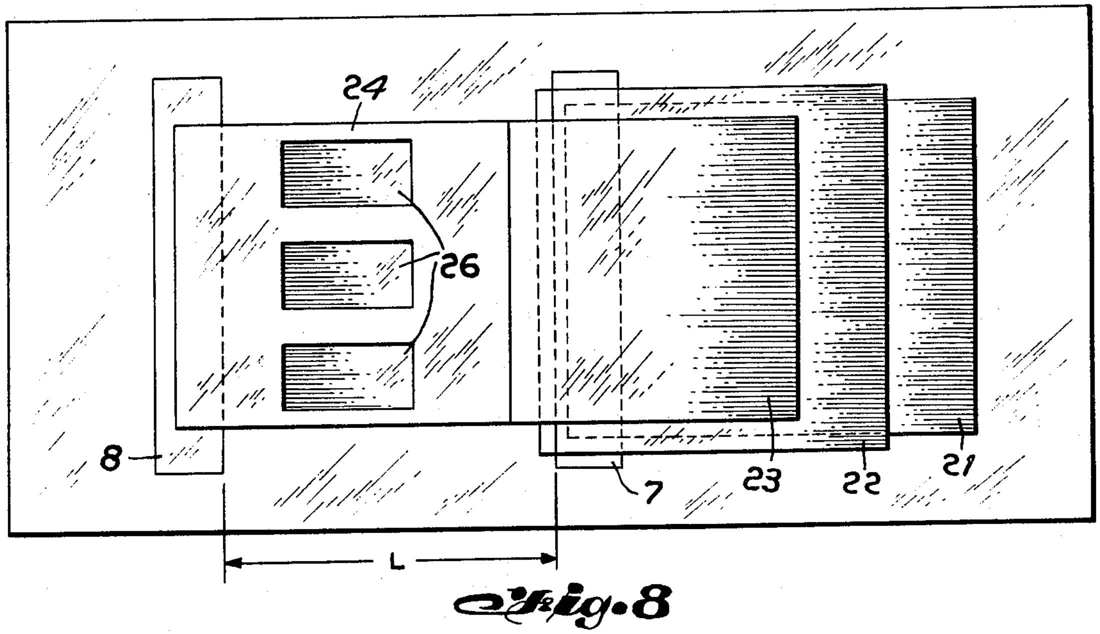
FIG. 9 is a top view of the impedance transforming network shown in FIG. 8.
Figure 8:
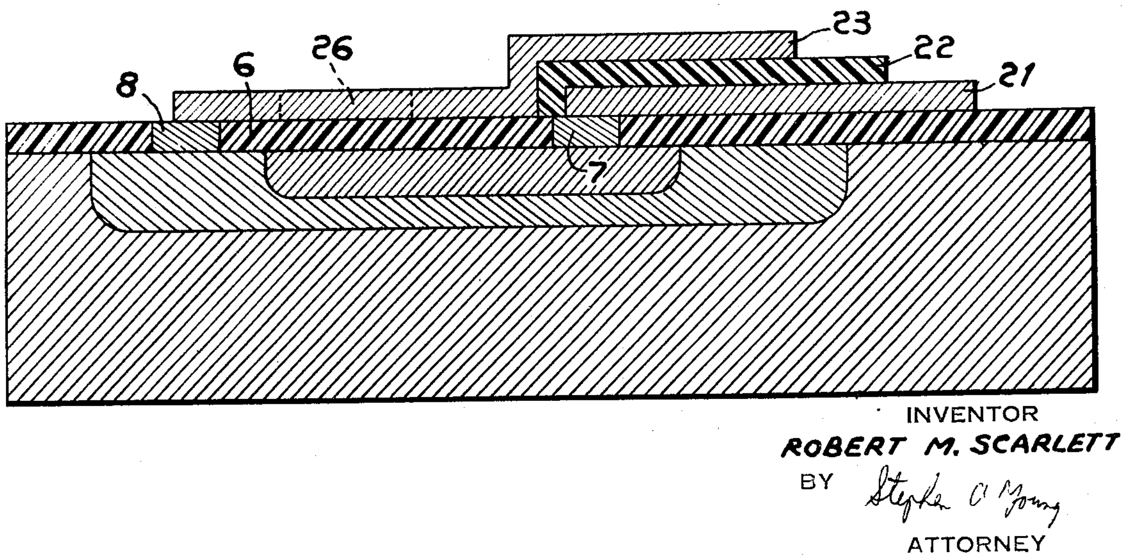
FIG. 8 is another embodiment of this invention using an LC network as the impedance transforming network.

FIG. 8 shows an alternate type of impedance transforming network attached to the substrate. Instead of using the film transformer of the previous embodiments, this embodiment just used an LC network coupled to the transistor. A thin film capacitor having a first electrode 21, dielectric layer 22 and a second electrode 23 is formed over emitter electrode 7 using the same or similar techniques as described in the formation of capacitor 20 shown in FIG. 7 when formed over the corresponding emitter electrode in FIG. 6. However, when electrode 23 is formed over dielectric 22, it can be deposited in a solid conductive sheet or layer which extends over insulating layer 6 until it overlaps and attaches to base electrode 8. FIG. 10, which is the equivalent circuit of the component in FIG. 8, shows the actual inductor 24 having one end directly connected to the base electrode and the other end connected to one electrode of the capacitor 25. Actually the effective inductance of inductor 24 is determined by that portion of sheet 23 which extends between the emitter and base electrodes for a distance $L$ as shown in FIG. 9. Using standard masking, photolithographic and etching techniques, apertures 26 can be formed within the inductive portion 24 of sheet 23. The formation of these apertures serves the purpose of effectively determining the final value of inductance 24. As previously indicated, conductive sheet 23 can be formed by typical evaporation techniques described above so as to evaporate a suitable conductive material, such as aluminum, copper or platinum, thereon.

Figure 11:
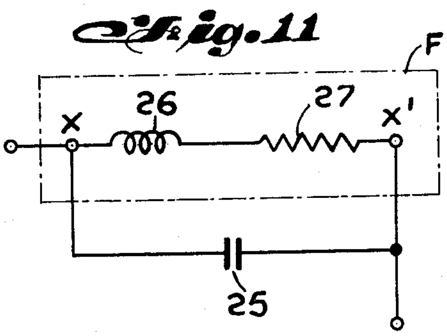
FIG. 11 is the equivalent passive circuit for the circuit enclosed within block E of FIG. 10.

FIG. 10 shows internal inductance 11 ($L_e'$) again between the emitter bonding pad and the emitter region and thus quite negligible. Inductor 2 which is external to the emitter bonding pad is common to both the input and output circuit for this embodiment. However, due to the impedance transformation performed by the equivalent circuit within block E of FIG. 10 as shown in FIG. 11, the allowable permissible inductance $L_e$ for inductive lead 2 can be greatly increased due to the following. Inductive element 26 is a composite of inductors 24 and 11 and resistor 27 is the effective resistance at the input of transistor 1 as seen from terminal A in FIG. 10. Capacitor 25 is the same as depicted in FIG. 10.

Figure 12:
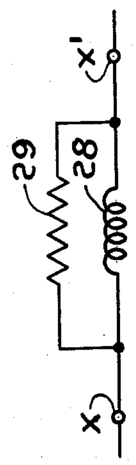
FIG. 12 is the approximate equivalent circuit of the network enclosed within block F of FIG. 11.

The following calculation will be performed to show that the series combination of inductor 26 and resistor 27 is equivalent to the parallel combination of inductor 28 and resistor 29 as shown in FIG. 12, where inductor 28 and resistor 29 would still be in parallel with capacitor 25. Taking the absolute value of the admittance ($Y_{xx'}$) across points $xx'$ as shown in FIG. 11, we have the following relationship:

$$\left|Y_{xx'}\right| = \left|\frac{1}{R_{in} + j\omega L}\right| \quad \text{(Equation 7)}$$

where $R_{in}$ is the input resistance to the transistor as depicted by resistor 27 shown in FIG. 11;

$L$ is the inductance value of inductor 26; and $\omega$ is the operating frequency in radians per second.

By multiplying the top and bottom of the above equation by $R_{in} - j\omega L$ $$Y_{xx'} = \frac{R_{in} - j\omega L}{R_{in}^2 + (\omega L)^2}$$

Since the Q of the circuit is equal to $$\frac{\omega L}{R_{in}}$$

then where Q is the quality factor for the circuit. Therefore, $$\left|Y_{xx'}\right| = \left|\frac{R_{in} - j\omega L}{R_{in}^2 + R_{in}^2 Q^2}\right| = \left|\frac{R_{in} - j\omega L}{R_{in}^2 (1 + Q^2)}\right|$$

Let us assume that $Q^2 \gg 1$ when $Q^2 \gtrsim 10$ and that $Q^2$ is greater than 10 for the above circuit. Then $(1-Q^2) \approx -Q^2$. Therefore, $$\left|Y_{xx'}\right| = \left|\frac{R_{in} - j\omega L}{R_{in}^2 Q^2}\right| = \left|\frac{R_{in}}{R_{in}^2 Q^2} - \frac{j\omega L}{R_{in}^2 Q^2}\right| =$$

$$\left|\left(\frac{1}{Q^2 R_{in}} - \frac{j\omega L}{(R_{in}^2)\left(\frac{\omega L}{R_{in}}\right)^2}\right)\right| = \left|\left(\frac{1}{Q^2 R_{in}} + \frac{1}{j\omega L}\right)\right|$$

Therefore, $$\left|Y_{xx'}\right| = \frac{1}{Q^2 R_{in}} + \frac{1}{j\omega L} \quad \text{(Equation 8)}$$

It is thus seen that the absolute value of the admittance across $xx'$ in the circuit shown in FIG. 11 is actually equivalent to the parallel combination of the admittance of resistor 29 which is equal to $Q_2R_{in}$ plus the admittance of inductor 28 which is equal to inductor 27 as shown in FIG. 11.

Figure 13:
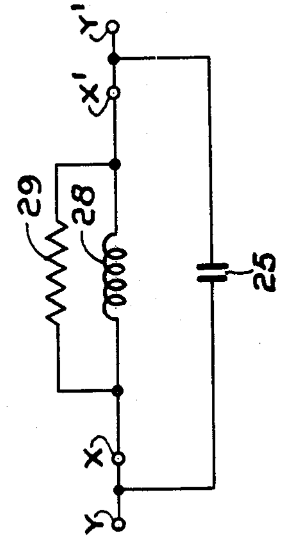
FIG. 13 shows FIG. 12 in parallel with a capacitor.

Now placing he circuit in FIG. 12 in parallel with capacitor 25, as shown in FIG. 13, the resonant frequency of the parallel combination of inductor 28 and capacitor 25 is defined by $$f_o = \frac{1}{(2\pi)(\sqrt{LC})} \quad \text{(Equation 9)}$$

$L$ being the value of inductance of inductor 28, and $C$ being the capacitance of capacitor 25.

At this resonant frequency, the value of the impedance at $yy'$ of FIG. 13 would be equivalent to the resistive value of resistor 29 which is equal to $Q^2R_{in}$, since the impedance of a parallel tuned LC circuit approaches infinity. Therefore, at this resonant frequency $f_o$, we actually have an effective resistive impedance step-up approximately equivalent to $$Q^2 = \left(\frac{2\pi f_0 L}{R_{in}}\right)^2 \quad \text{(Equation 10)}$$

The bandwidth around $f_o$ over which the impedance step-up is effective is defined by $$B = (f_o/Q) \quad \text{(Equation 11).}$$

If an impedance step-up of at least 25 would be desired, then $Q \approx 5$, and for the Example 2 given in the background of the invention when $R_{in} = 0.125$ ohms, then at a frequency $f = 2$ GHz and using Equation 10 to solve for $L$, $L = 0.05$ nhy.

For L = 0.05 nhy and a resonant frequency $f_o = 2$ GHz, then using Equation 9 and solving for $C$, $C$ would be equal to 130 picofarads.

If $f_o = 2$ GHz and $Q = 5$, then using Equation 11, the bandwidth, $B = 400$ MHz.

This value $L$ of 0.05 nhy is reasonably obtainable for film inductor 24 and the capacitive value $C = 130$ pF is also readily obtainable for film capacitor 25. We thus can obtain a substantial impedance transformation of 25 times over a frequency range of 400 MHz for a center frequency of 2 GHz. Therefore, the value of the ($L_e$) lead inductance 2 common both to the input and output circuit which can be tolerated at the higher critical frequencies would be 25 times the critical value calculated in Example 2 or $L_e = (\cong)(0.01)$ nhy $= 0.25$ nhy. A value of less than 0.25 nhy can be readily achieved for stripline packages, thus allowing for improved high frequency, high power transistor performance for components which have LC impedance transforming networks as shown in FIGS. 8 to 10.

I claim:

1. A semiconductor component comprising an active semiconductor device formed within a substrate, said device having an emitter, base and collector, said base being formed from one surface of said substrate within said collector and said emitter being formed from said one surface of said substrate within said base, a first insulating layer formed on said one surface of said substrate and a base and emitter electrode formed on said one surface and attached to the corresponding base and emitter regions, an impedance transforming network incorporated on said substrate and coupled to said device so as to reduce the effect of the device lead inductance which is common to both a circuit input and output, said impedance transforming network being coupled to said base and emitter, said impedance transforming network including a transformer having a primary winding and a secondary winding, said secondary winding being coupled to said base and emitter electrodes and said primary winding being coupled to pads on said substrate to provide for input terminals for said device, said primary winding having an upper and lower portion, said lower primary portion being placed on and contiguous with said first insulating layer, a core of ferromagnetic material having high insulation resistance and high magnetic permeability, said core having a slot and an upper and a lower portion, said lower core portion placed on said lower primary portion, said upper primary portion being placed within said core slot and on said lower portion of said core, said upper primary portion being contiguous with said lower primary portion, a second insulating layer within said core slot disposed over said upper portion of said primary winding, and extended to and contiguous with said first insulating layer, said secondary winding placed within said core slot positioned over said second insulating layer, and said upper portion of said core disposed on said secondary winding, said upper core portion being connected to said lower core portion to provide a closed magnetic flux path for said primary and secondary windings.

2. A semiconductor component comprising an active semiconductor device formed within a substrate, said device having an emitter, base and collector, said base being formed from one surface of said substrate within said collector and said emitter being formed from said one surface of said substrate within said base, a first insulating layer formed on said one surface of said substrate and a base and emitter electrode formed on said one surface and attached to the corresponding base and emitter regions, an impedance transforming network incorporated on said substrate and coupled to said device so as to reduce the effect of the device lead inductance which is common to both a circuit input and output, said impedance transforming network being coupled to said base and emitter, said impedance transforming network including a thin film inductor and capacitor disposed on said substrate, one terminal of said inductor being coupled to said base electrode, one terminal of said capacitor being coupled to said emitter electrode, and the other terminal of said inductor being coupled to the other terminal of said capacitor.

3. A semiconductor component comprising an active semiconductor device formed within a substrate, said device having an emitter, base and collector, said base being formed from one surface of said substrate within said collector and said emitter being formed from said one surface of said substrate within said base, a first insulating layer formed on said one surface of said substrate and a base and emitter electrode formed on said one surface and attached to the corresponding base and emitter regions, an impedance transforming network incorporated on said substrate and coupled to said device so as to reduce the effect of the device lead inductance which is common to both a circuit input and output, said impedance transforming network being coupled to said base and emitter, said impedance transforming network including a transformer having a primary winding and a secondary winding, said secondary winding being coupled to said base and emitter electrodes and said primary winding being coupled to pads on said substrate to provide for input terminals for said device, said primary and secondary windings being conductive films, said secondary winding having one turn, and said primary winding having n number turns so as to provide for an $n^2$ impedance step up from said base and emitter to the input terminals of said primary windings, said transformer further comprising a core of ferromagnetic material having high insulation resistance and high magnetic permeability, said core having a slot and an upper and a lower portion, said lower portion placed on said first insulating layer, said secondary winding placed through said core slot on said lower portion of said core, one end of said secondary winding being attached to said base electrode and the other end of said secondary winding being attached to said emitter electrode, and said primary windings formed around said upper core portion.

4. A semiconductor component comprising an active semiconductor device formed within a substrate, said device having an emitter, base and collector, said base being formed from one surface of said substrate within said collector and said emitter being formed from said one surface of said substrate within said base, a first insulating layer formed on said one surface of said substrate and a base and emitter electrode formed on said one surface and attached to the corresponding base and emitter regions, an impedance transforming network incorporated on said substrate and coupled to said device so as to reduce the effect of the device lead inductance which is common to both a circuit input and output, said impedance transforming network being coupled to said base and emitter, said impedance transforming network including a transformer having a primary winding and a secondary winding, said primary winding being coupled to pads on said substrate to provide for input terminals for said device, one terminal of said primary winding being attached to one terminal of said secondary winding, and a capacitor disposed on said substrate, one terminal of said capacitor being coupled to said emitter electrode, the other terminal of said capacitor being coupled to said one terminal of secondary winding, and the other terminal of said secondary winding being coupled to said base electrode.

5. A semiconductor component according to claim 2 further including:

- said one capacitor terminal comprising a first film electrode disposed on said emitter electrode and contiguous with a portion of said first insulating layer;
- a dielectric layer placed on said one capacitor terminal;
- said other capacitor terminal comprising a second film electrode on said dielectric layer, said second film extending over said first insulating layer and disposed on said base electrode, that portion of said second film disposed on said base electrode being said one inductor terminal, that portion of said second thin film disposed on said dielectric layer being said other inductor terminal, and the remaining portion of said second thin film being said inductor.

6. A semiconductor component according to claim 6 wherein the inductive portion of said second thin film has slots formed therein so as to precisely determine the inductive value of said inductor.

7. A semiconductor component according to claim 4 wherein said transformer further comprises:

said primary winding having an upper and lower portion, said lower primary winding placed on and contiguous with said first insulating layer;

a core of ferromagnetic material having high insulation resistance and high magnetic permeability, said core having a slot and an upper and a lower portion, said lower core portion placed on said lower primary winding said upper primary winding being placed within said core slot and on said lower portion of said core, said upper primary winding being contiguous with said lower primary winding;

a second insulating layer within said core slot placed over said upper portion of said primary turns and extended to be contiguous with said first insulating layer;

said one capacitor terminal comprising a first film electrode placed on said emitter electrode and contiguous with a portion of said first insulating layer;

a dielectric layer placed on said one capacitor terminal;

said secondary winding placed within said core slot positioned over said second insulating layer; and said upper portion of said core disposed on said secondary winding, said upper core portion being connected to said lower core portion to provide for a closed magnetic flux path for said primary and secondary windings.

* * * * *